May 12, 1964 R. A. HENLE ETAL Re. 25,573
TRANSISTOR POWER INVERTER CIRCUIT
Original Filed Oct. 30, 1956
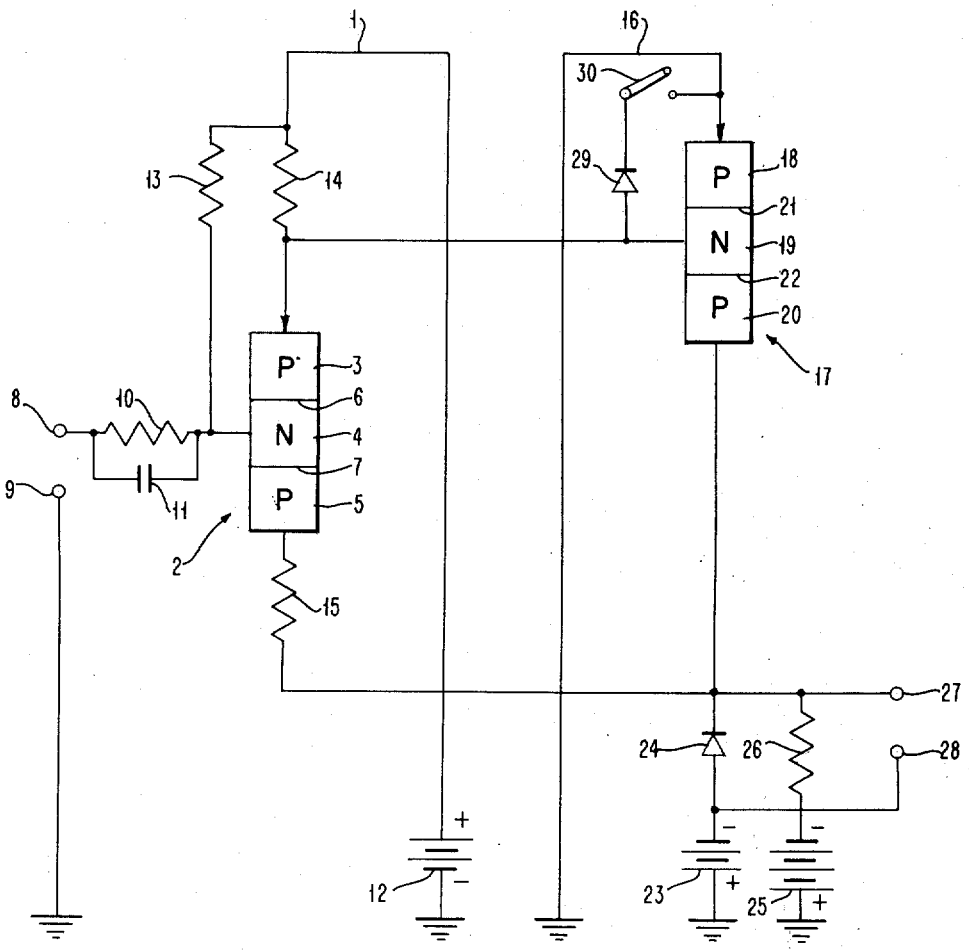
INVENTORS
ROBERT A. HENLE
JAMES B. MACKAY
BY Alvin J. Riddles
ATTORNEY United States Patent Office Re. 25,573
Reissued May 12, 1964

25,573

TRANSISTOR POWER INVERTER CIRCUIT

Robert A. Henle, Hyde Park, and James B. Mackay, Poughkeepsie, N.Y., assignors to International Business Machines Corporation, New York, N.Y., a corporation of New York Original No. 2,947,879, dated Aug. 2, 1960, Ser. No. 619,146, Oct. 30, 1956. Application for reissue June 15, 1961, Ser. No. 120,128
7 Claims. (Cl. 307—88.5)

Matter enclosed in heavy brackets [ ] appears in the original patent but forms no part of this reissue specification; matter printed in italics indicates the additions made by reissue.

This invention relates to transistor switching circuits and in particular to high speed transistor power circuits.

In the development of transistor circuitry for power applications, two major problems are encountered. The first of these is an impedance matching problem arising from the fact that a capacitive or a high current requiring load generally has an impedance lower than that required by the driving source. Some solutions to this problem that have appeared in the art have been the use of impedance matching devices such as transformers and amplifiers. A second problem arises as a result of the current handling capabilities with respect to speed. In a transistor, at the beginning of a conduction period, a finite length of time is required to provide a sufficient carrier concentration to provide the desired current. This time is referred to as "turn on delay." In addition, at the end of a conduction period the presence of minority carriers in the vicinity of the collector tend to continue current flow as long as they reach the collector. This may be referred to as minority carrier storage or "turn off delay." In high speed circuits these delays frequently become an appreciable portion of the cycle time of the circuit.

This invention accomplishes the solution to the above problems by using two conventional transistors coupled together in a two stage circuit wherein the first stage serves the functions of impedance matching, "turn on delay" control and "turn off delay" control for the second stage which provides power to the load.

A primary object of this invention is to provide a high-speed-high-current transistor circuit.

Another object is to provide a high current and high speed transistor circuit using conventional transistors.

A related object is to provide a two stage transistor circuit wherein the first stage presents a high input impedance to a driving source and prevents current saturation in the second stage.

Other objects of the invention will be pointed out in the following description and claims and illustrated in the accompanying drawings, which disclose, by way of example, the principle of the invention and the best mode, which has been contemplated of applying that principle.

In the drawings:

The single figure is a two transistor power inverter circuit illustrating the invention.

Referring now to the figure, the first stage 1 of the circuit is made up of a first transistor 2 having an emitter region 3, a base region 4 and a collector region 5 separated by junctions 6 and 7. External input terminals 8 and 9 are connected to apply signals to the base 4 of transistor 2. Decoupling and pulse shaping means are generally employed in these circuits and in this illustration this is accomplished by a resistor 10 and capacitor 11 in parallel. The base 4 is connected to the positive terminal of a potential source such as battery 12 through resistor 13, and the emitter 3 is connected to the positive terminal of battery 12 through resistor 14. A series impedance shown as resistor 15 is provided connected to the collector 5 of transistor 2 for purposes to be later described. The second stage 16 of the circuit of the figure includes a transistor 17 having an emitter 18, a base 19 and a collector 20 separated by junctions 21 and 22. The emitter 18 is connected to a reference potential or ground. The base 19 is connected to the emitter 3 of stage 1 and the collector 20 is connected to one negative potential at battery 23 through diode 24 to establish a definite "off" potential level and to a more negative potential source 25 through a load impedance shown as resistor 26. Resistor 15 is connected to collector 20 of transistor 17. External output terminals 27 and 28 are provided to deliver signals developed across the load 26. It will be apparent from later discussion that the function of diode 24 and potential source 23 is to establish a definite negative potential level for the output, and to speed "turn off" when driving a capacitive load. An impedance, shown for example, as a diode 29 connected through switch 30 is placed between the base 19 and emitter 18 of transistor 17, to reduce "turn on" time by limiting the reverse bias on junction 21, as is well known in the art and for other advantages to be later described.

OPERATION

In one of its functions, stage 1 of the circuit of the figure follows the behavior of a circuit known in the art as an "Emitter Follower."

Circuits of this type are characterized by the presence of current flowing through the transistor, which current is changed by the presence of an input signal applied to the base of the transistor. Such circuits are described in copending U.S. application, Serial Number 459,382, filed September 30, 1954, now Patent Number 2,888,578 and assigned to the assignee of this application. In the circuit of the figure current flows from battery 12 through transistor 2 to the negative potential of battery 25. The potential level at terminal 27 is established by the combination of battery 23 and diode 24 which prevent the potential level of terminal 27 from becoming appreciably more negative than that of battery 23. An input signal appearing at terminals 8 and 9 going from an arbitrarily selected off level value of approximately —2 volts or more positive to an "on level" value of approximately —8 volts or more negative is applied to the base 4 of transistor 2 through decoupling resistor and pulse shaping capacitor combination 10 and 11, respectively, thereby causing an increased current to flow through transistor 2. This increase in current produces a potential shift across resistor 14 causing the emitter 3 of transistor 2 to move toward negative potential following the input signal. The second stage 16 of the circuit of the figure performs the function of a circiut known in the art as an "Inverter." Circuits of this type are characterized by the fact that no appreciable transistor current flows in the no signal condition and the output signal is an amplified inversion of the input signal. An example of such a circuit is described in copending application, Serial Number 459,322, filed September 30, 1954, now Patent Number 2,891,172.

In the no signal condition, transistor 17 has no appreciable current flowing through it. This is due to the fact that the emitter junction 21 is reverse biased by the base 19 being connected to positive potential through resistor 14. When a negative signal is impressed on input terminals 8 and 9, the negative excursion of the emitter 3 of transistor being coupled to the base 19 of transistor 17, turns on transistor 17, causing a heavy current to flow from ground at the emitter 18 through collector 20 and the resistor 26 to the negative potential of battery 25. The heavy initial current flow through transistor 17 is acquired by virtue of the very low output impedance of stage 1, hence the signal applied to the base 19 approximates a voltage source. As this heavy current flows in the stage 16 of the circuit, the potential drop across resistor 26 raises the potential at the collector 20 and output terminal 27 providing thereby an inverted reproduction of the input signal. The potential rise at terminal 27 being coupled to the collector 5 of transistor 2 serves to reduce the collector potential of transistor 2 as will be discussed later.

When the input signal at terminals 8 and 9 returns to −2 volts or more positive, the positive potential at battery 12 applied through resistor 13 raises the potential level of the base 4 of transistor 2 to at least a certain minimum level. This causes the emitter 3 to move toward positive potential and being connected to the base 19 of transistor 17 raises the potential level of the base 19 sufficiently to cut off the heavy current flow through resistor 17. The cessation of current flow in stage 16 of this circuit permits the potential level at terminal 27 to return toward the negative potential of battery 25 until the combination of battery 23 and diode 24 establishes the desired no signal potential level of battery 23.

It should be noted that for proper operation, the value of resistor 13 is of importance. It is necessary that when the input signal level is as negative as −2 volts transistor 17 be cut off. To achieve this, resistor 13 must have a suitable value so that base 4 of transistor 2 is sufficiently positive to keep emitter 3, which approximately follows base 4, high enough to ensure a reverse bias across the emitter base junction 21 of transistor 17.

The fast turn on and fast turn off of this circuit are achieved in the following ways:

With respect to the fast turn on advantage. The relatively high input impedance first stage of this circuit places a minimum load on the driving circuitry and provides an amplified low-impedance replica of the input signal which serves to literally pull on the inventer stage 16. This is accomplished by effectively causing the base 19 of transistor 17 to approach the same potential excursion as the input signal with an $(\alpha'+1)$ current amplification until this excursion is limited by the very low potential drop across junction 21. $\alpha'$ is defined in the art as the base to collector current amplification factor of transistor 2. This produces an accelerated carrier injection rate across junction 21, and thereby a fast "turn on" of transistor 17.

The fast turn off of this circuit is achieved through the use of stage 1 of this circuit in the heavy current condition to serve as a base to collector non-linear regulating impedance to keep transistor 17 out of saturation. In circuit applications, saturation is generally manifested by a phenomenon wherein the collector potential of a transistor approaches more closely the emitter potential than does the base. In this circuit configuration saturation would mean that the potential of collector 20 of transistor 17 becomes equal to or more positive than that of base 19. In the circuit of this invention this is prevented by stage 1 which performs a different function at this time. As the collector potential of transistor 17 rises, due to heavy current flowing through resistor 26, this potential is applied through resistor 15 to the collector of transistor 2 and tends to turn off the first stage. This circuit reaches an equilibrium state where transistor 2 is saturated, and the series drop across transistor 2 and resistor 15 determines how far short of saturation transistor 17 operates. It will then be apparent that the series impedance 15 is the determining factor as to where stage 1 of this circuit establishes the output of stage 16 so as to prevent saturation in stage 16. Although transistor 2 is in saturation, its collector current is a small fraction of the load current, and "turn off delay" does not present a serious problem.

An improvement in the operation of the circuit of the figure may be realized by closing switch 30 thereby connecting diode 29 between the emitter 18 and the base 19 of transistor 17. One obvious advantage of the use of diode 29 is the limitation of the reverse bias of junction 21 to the forward potential difference across this diode, thus providing a reduction of the "turn on delay" of transistor 17. Another advantage of the use of this diode is the establishment of a small positive known limit for the potential level of the emitter 3 of transistor 2 in the no signal condition. With the potential level of the emitter 3 at a small known value the combination of resistors 10 and 13 may be easily selected so as to reverse bias junction 6 thereby cutting off transistor 2 in the no signal condition, hence essentially eliminating power dissipation therein, while at the same time retaining all of the impedance, matching, turn on and saturation limiting advantages previously described. It will then follow that the value of resistor 14 may be reduced to permit potential source 12 to turn off transistor 17 more rapidly since with transistor 2 cut off in the no signal condition, the power dissipation in this transistor need not be limited by this resistor.

The following values are given to aid in understanding and practicing the invention, it being understood that they should not be construed as limitations since as is well known in the art a wide range of component values are possible and that the selection of potentials and parameters of transistors is purely arbitrary. For example, it will be apparent to one skilled in the art that the interchange of PNP and NPN transistors may be readily accomplished.

| | |
|---|---|
| Transistor 2 | Germanium PNP—alloy Junction—$\alpha \geq .97$ frequency cut off $\geq 5$ megacycles. |
| Transistor 17 | Germanium PNP—alloy Junction—$\alpha \geq .92$ frequency cut off $\geq 5$ megacycles. |
| Diodes 24 and 29 | Germanium—back resistance 100,000 ohms forward drop 0.2 to 0.7 volt at 10 to 50 ma. current. |
| Resistor 10 | 5100 ohms. |
| Capacitor 11 | 470 micromicrofarads. |
| Resistor 13 | 20,000 ohms. |
| Resistor 14 | 7,500 ohms. |
| Resistor 15 | 51 ohms. |
| Resistor 26 | 6,800 ohms. |
| Battery 12 | 20 volts. |
| Battery 23 | 10 volts. |
| Battery 25 | 30 volts. |
| Switch 30 | Single pole-single throw. |
| Input signal | 0 to −10 volts. |
| Output signal | −10 volts to −0.5 volt. |

The above values are approximate due to variations in individual components but should give an example of order of magnitude. The circuit of this invention constructed according to the above specifications will switch 50 to 80 milliampere currents through a capacitive load of 10,000 micromicrofarads at a repetition rate of 250,000 cycles per second.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the following claims.

What is claimed is:

1. A transistor circuit comprising in combination a common power source having one polarity terminal thereof connected to reference potential, a common load impedance having one terminal connected to the remaining terminal of said common power source, a first transistor having emitter, base and collector connections and being of a polarity type compatible with the polarity of said common power source having the collector connection thereof connected to the remaining terminal of said load impedance and having the emitter connection thereof connected to reference potential, a second transistor of a conductivity type the same as said first transistor having emitter, base and collector connections having the emitter thereof connected to said base of said first transistor, an auxiliary power source having one terminal of a polarity opposite to said common power source connected to reference potential, an emitter impedance having a first terminal connected to the remaining terminal of said auxiliary power source and having the remaining terminal thereof connected to said emitter of said second transistor, a biasing impedance having one terminal connected to said base of said second transistor and having the remaining terminal thereof connected to said first terminal of said emitter resistor, a collector impedance having one terminal connected to the collector of said second transistor and having the remaining terminal thereof connected to said collector of said first transistor and signal introduction means operable to apply input signals to said base of said second transistor.

2. A transistor circuit comprising in combination a common power source having one polarity terminal thereof connected to reference potential, a common load impedance having one terminal connected to the remaining terminal of said common power source, a first transistor having emitter, base and collector connections and being of a polarity type compatible with the polarity of said common power source having the collector connection thereof connected to the remaining terminal of said load impedance and having the emitter connection thereof connected to reference potential, a diode connected in the low impedance direction between said base connection and said emitter connection of said first transistor, a second transistor of a conductivity type the same as said first transistor having emitter, base and collector connections having the emitter thereof connected to said base of said first transistor, an auxiliary power source having one terminal of a polarity opposite to said common power source connected to reference potential, an emitter impedance having a first terminal connected to the remaining terminal of said auxiliary power source and having the remaining terminal thereof connected to said emitter of said second transistor, a biasing impedance having one terminal connected to said base of said second transistor and having the remaining terminal thereof connected to said first terminal of said emitter resistor, a collector impedance having one terminal connected to the collector of said second transistor and having the remaining terminal thereof connected to said collector of said first transistor and signal introduction means operable to apply input signals to said base of said second transistor.

3. A transistor circuit comprising in combination a first D.C. power source having the positive terminal thereof connected to reference potential, a first impedance having one terminal connected to the negative terminal of said first power source, a first PNP type transistor having emitter, base and collector connections having said collector connected to the remaining terminal of said first impedance and having said emitter connected to reference potential, a second PNP type transistor having emitter, base and collector connections and having said emitter connected to the base of said first transistor, a diode having the cathode thereof connected to the base connection of said first transistor and having the anode thereof connected to said reference potential, a second D.C. power source having the negative terminal thereof connected to reference potential, a second impedance having one terminal connected to the positive terminal of said second power source and having the remaining terminal connected to the emitter of said second transistor, a third impedance having one terminal connected to the positive terminal of said second power source and having the remaining terminal connected to the base of said second transistor, a fourth impedance having one terminal connected to the collector of said second transistor and having the remaining terminal connected to the collector of said first transistor and signal input means coupled to the base of said second transistor.

4. A transistor circuit comprising in combination a first D.C. power source having the negative terminal thereof connected to reference potential, a first impedance having one terminal connected to the positive terminal of said first power source, a first NPN type transistor having emitter, base and collector connections having said collector connected to the remaining terminal of said first impedance and having said emitter connected to reference potential, a diode having the anode thereof connected to the base connection of said first transistor and having the cathode thereof connected to said reference potential, a second NPN type transistor having emitter, base and collector connections and having said emitter connected to the base of said first transistor, a second D.C. power source having the positive terminal thereof connected to reference potential, a second impedance having one terminal connected to the negative terminal of said second power source and having the remaining terminal connected to the emitter of said second transistor, a third impedance having one terminal connected to the negative terminal of said second power source and having the remaining terminal connected to the base of said second transistor, a fourth impedance having one terminal connected to the collector of said second transistor and having the remaining terminal connected to the collector of said first transistor and signal input means coupled to the base of said second transistor.

*5. In a binary signal system in which a first binary means supplies binary input signals and in which a second binary means operates in response to binary output signals, the combination with said first and second binary means of an amplifier, said amplifier comprising a plurality of semiconductive devices each having base, emitter, and collector electrodes, means connecting said emitter electrode of a first one of said devices to said base electrode of said second device so that base-emitter and collector-emitter currents of said first device flow in the base-emitter path of said second device, bias means connected to said first device base electrode means for connecting said first binary means to supply input signals to said first device base electrode, an output impedance having a first and a second terminal, means connecting said first terminal to the collector electrodes of said first and second devices for receiving currents flowing in the collector-emitter paths thereof and for supplying said binary output signals to said second binary means, means for supplying an operating potential to said second terminal, means connecting a common return path to said second device emitter electrode, to said first binary means, and to said operating potential supplying means, the bias of said bias means and one of said binary input signals supplied by said first means being of such direction and of magnitude sufficient to combine to drive said first device to saturation, at least one of said output impedance and connecting means including voltage dropping means and being such that the potential difference from said second device collector electrode to said second device base electrode produced via said first device emitter-collector path during saturation tends to prevent forward conduction in the collector-base path of said second device and thereby to prevent said second device from saturating, said bias and the other of said binary signals supplied by said first binary means being such as to place said first device in a cutoff condition, and means for supplying current in the reverse direction to said second device base-emitter path to cutoff said second device when said other binary signal is supplied to place said first device in a cutoff condition, said current supplying means including a resistor having a terminal connected to said second device base electrode, and means for supplying a potential to another terminal of said resistor in a direction to bias said base-emitter path of said second device in the reverse direction.*

*6. In a binary signal system in which a first binary means supplies binary input signals and in which a second binary means operates in response to binary output signals, the combination with said first and second binary means of an amplifier, said amplifier comprising a plurality of transistors each having base, emitter, and collector electrodes, means connecting said emitter electrode of a first one of said transistors to said base electrode*

*of said second transistor so that base-emitter and collector-emitter currents of said first transistor flow in the base-emitter path of said second transistor, means for connecting said first binary means to supply input signals to said first transistor base electrode, an output impedance having a first and a second terminal, means connecting said first terminal to the collector electrodes of said first and second transistors for receiving currents flowing in the collector-emitter paths thereof and for supplying said binary output signals to said second binary means, means connecting a common return path to said second transistor emitter electrode, to said first binary means, and to said second terminal of said output impedance, and reverse bias means connected to said first transistor base electrode and to said common return path for biasing said transistors to cutoff condition, one of said binary input signals supplied by said first means being a current of such direction and of magnitude sufficient to overcome the bias of said means and to drive said first transistor to saturation, said output means impedance and connecting means being such that the potential difference from said second transistor collector electrode to said second transistor base electrode produce via said first transistor emitter-collector path during saturation tends to prevent forward conduction in the collector-base path of said second transistor and thereby to prevent said second transistor from saturating, the other of said binary signals supplied by said first binary means being such as to permit said reverse bias means to place said first transistor in a cutoff condition, and means for supplying current in the reverse direction to said second device base-emitter path to cut off said second device when said other binary signal is supplied to place said first device in a cutoff condition.*

*7. In a binary signal system in which a first binary means supplies binary input signals and in which a second binary means operates in response to binary output signals, the combination with said first and second binary means of an amplifier, said amplifier comprising a plurality of semiconductive devices each having base, emitter, and collector electrodes, means connecting said emitter electrode of a first one of said devices to said base electrode of said second device so that base-emitter and collector-emitter currents of said first device flow in the base-emitter path of said second device, bias means connected to said first device base electrode, means for connecting said first binary means to supply input signals to said first device base electrode, an output impedance having a first and a second terminal, means connecting said*

*first terminal to said collector electrodes for receiving currents flowing in the collector-emitter paths of said first and second devices and for supplying said binary output signals to said second binary means, means for supplying an operating potential to said second terminal, means connecting a common return path to said second device emitter electrode, to said first binary means, and to said operating potential supplying means, the bias of said bias means and one of said binary input signals supplied by said first means being of such direction and of magnitude sufficient to combine to saturate said first device, at least one of said output impedance and connecting means including voltage dropping means and being such that the potential difference from said second device collector electrode to said second device base electrode produced via said first device emitter-collector path during saturation tends to prevent forward conduction in the collector-base path of said second device and thereby to prevent said second device from saturating, said bias and the other of said binary signals supplied by said first binary means being such as to place said first device in a cutoff condition, means for supplying current in the reverse direction to said second device base-emitter path to cutoff said second device when said other binary signal is supplied to place said first device in a cutoff condition, said current supplying means including an impedance element having a terminal connected to said second device base electrode, and means for connecting another terminal of said impedance element to said common return path, and a diode connected across said base-emitter path of said second device and poled to clamp the potential of said second device base-electrode to the potential of said second device emitter electrode.*

References Cited in the file of this patent or the original patent

UNITED STATES PATENTS

| | | |
|---|---|---|
| 2,663,806 | Darlington | Dec. 22, 1953 |
| 2,663,830 | Oliver | Dec. 22, 1953 |
| 2,845,583 | Reuther et al. | July 29, 1958 |
| 2,860,259 | Odell et al. | Nov. 11, 1958 |

OTHER REFERENCES

Publication entitled "Handbook of Semiconductor Electronics," by Lloyd P. Hunter, published by McGraw-Hill Book Co. Inc., October 15, 1956, pp. 15–47, Figs. 15.45(a).